(12) United States Patent
Komori et al.

(10) Patent No.: US 10,782,340 B2
(45) Date of Patent: Sep. 22, 2020

(54) DYNAMIC RESPONSE ANALYSIS PROBER DEVICE

(71) Applicant: Hitachi High-Tech Corporation, Minato-ku, Tokyo (JP)

(72) Inventors: Masaaki Komori, Tokyo (JP); Katsuo Oki, Tokyo (JP); Yasuhiko Nara, Tokyo (JP); Takayuki Mizuno, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 8 days.

(21) Appl. No.: 15/737,966

(22) PCT Filed: Jul. 7, 2016

(86) PCT No.: PCT/JP2016/070072
§ 371 (c)(1),
(2) Date: Dec. 19, 2017

(87) PCT Pub. No.: WO2017/018148
PCT Pub. Date: Feb. 2, 2017

(65) Prior Publication Data
US 2018/0299504 A1 Oct. 18, 2018

(30) Foreign Application Priority Data
Jul. 29, 2015 (JP) .................................. 2015-149172

(51) Int. Cl.
*G01R 31/28* (2006.01)
*G01R 1/073* (2006.01)
(Continued)

(52) U.S. Cl.
CPC ......... *G01R 31/2889* (2013.01); *G01R 1/073* (2013.01); *G01R 31/2603* (2013.01);
(Continued)

(58) Field of Classification Search
None
See application file for complete search history.

(56) References Cited

U.S. PATENT DOCUMENTS

| 6,094,972 A * | 8/2000 | Yasutake | G01Q 10/06 73/105 |
| 2002/0063213 A1* | 5/2002 | Itsuji | G01N 23/20 850/33 |

(Continued)

FOREIGN PATENT DOCUMENTS

| CN | 1924600 A | 3/2007 |
| CN | 101119109 A | 2/2008 |

(Continued)

OTHER PUBLICATIONS

Translation of JP 2001-223585 Takahashi et al (Year: 2001).*

(Continued)

*Primary Examiner* — Jermele M Hollington
(74) *Attorney, Agent, or Firm* — Crowell & Moring LLP (57) ABSTRACT

The present invention relates to a prober device that shapes an input waveform of a dynamic electric signal to be input to one of probes, and observes an output waveform of the dynamic electric signal output through a sample, or preferably shapes the input waveform such that the output waveform of the dynamic electric signal output through the sample becomes approximately a pulse shape, when a response analysis of a dynamic signal is performed with respect to a fine-Structured device. With this, the response analysis of a high-speed dynamic signal equal to or greater than a megahertz level can be performed with respect to the fine-Structured device such as a minute transistor configuring an LSI.

8 Claims, 5 Drawing Sheets

(51) Int. Cl.
*H01J 37/28* (2006.01)
*G02B 21/00* (2006.01)
*G01R 31/26* (2020.01)

(52) U.S. Cl.
CPC ......... *G01R 31/2879* (2013.01); *G02B 21/00* (2013.01); *H01J 37/28* (2013.01); *G01R 31/2822* (2013.01); *G01R 31/2841* (2013.01); *H01J 2237/2008* (2013.01); *H01J 2237/24592* (2013.01)

(56) References Cited

U.S. PATENT DOCUMENTS

| | | | | |
|---|---|---|---|---|
| 2005/0139781 | A1* | 6/2005 | Hazaki | G01R 31/2891 250/442.11 |
| 2007/0050170 | A1 | 3/2007 | Noguchi et al. | |
| 2007/0113630 | A1* | 5/2007 | Matsumoto | B82Y 35/00 73/105 |
| 2008/0013645 | A1 | 1/2008 | Muto et al. | |
| 2008/0149848 | A1* | 6/2008 | Suzuki | G01R 31/307 250/443.1 |
| 2009/0145209 | A1* | 6/2009 | Matsumoto | B82Y 35/00 73/105 |
| 2009/0224788 | A1* | 9/2009 | Sasajima | G01R 31/2891 324/754.21 |
| 2011/0140729 | A1 | 6/2011 | Nakamura et al. | |

FOREIGN PATENT DOCUMENTS

| | | | | |
|---|---|---|---|---|
| JP | 2000-162276 | A | 6/2000 | |
| JP | 2001-223585 | A | 8/2001 | |
| JP | 2008-22392 | A | 1/2008 | |
| JP | 2010-40953 | A | 2/2010 | |
| JP | 2010-243218 | A | 10/2010 | |
| JP | 2010243218 | A | * 10/2010 | ... H01L 2224/48091 |
| JP | 2011-2402 | A | 1/2011 | |
| JP | 2013-187510 | A | 9/2013 | |

OTHER PUBLICATIONS

Translation of JP 2010-243218 Morishita et al (Year: 2010).*
Translation of JP 2013-187510 Yasuhiko (Year: 2013).*
Korean-language Office Action issued in counterpart Korean Application No. 10-2017-7037676 dated Jan. 11, 2019 with English translation (10 pages).
International Search Report (PCT/ISA/210) issued in PCT Application No. PCT/JP2016/070072 dated Sep. 13, 2016 with English translation (Four (4) pages).
Japanese-language Written Opinion (PCT/ISA/237) issued in PCT Application No. PCT/JP2016/070072 dated Sep. 13, 2016 (Four (4) pages).
International Preliminary Report on Patentability (PCT/IB/338 & PCT/IB/373) issued in PCT Application No. PCT/JP2016/070072 dated Feb. 8, 2018, including English translation of Document C2 (Japanese-language Written Opinion (PCT/ISA/237)) previously filed on Dec. 19, 2017 (Eight (8) pages).
Korean-language Office Action issued in counterpart Korean Application No. 1020177037676 dated Oct. 7, 2019 with English translation (10 pages).
Korean-language Office Action issued in counterpart Korean Application No. 10-2017-7037676 dated Aug. 12, 2019 with English translation (six (6) pages).
Chinese-language Office Action issued in counterpart Chinese Application No. 201680042308.X dated Dec. 24, 2019 with partial English translation (14 pages).

* cited by examiner

DYNAMIC RESPONSE ANALYSIS PROBER DEVICE

TECHNICAL FIELD

The present invention relates to a prober device for fine-Structured device characteristic evaluation, and particularly relates to a failure analysis of a fine-Structured device using a dynamic response analysis.

BACKGROUND ART

By miniaturization of an electronic device, high-speed and high-performance of a large-scale integration (LSI) are attempted. On the other hand, with the miniaturization of such an electronic device, the number of transistors, the number of wirings, and the number of contacts are increasing. Therefore, the failure analysis of malfunction products or the like is becoming more complicated.

In the related art, the failure analysis of the electronic device is performed by observing a structural defect of a narrowed down estimated defective position after narrowing down a defective position by various nondestructive analyses.

At the time of observing the structural defect, a destructive analysis on an estimated defective position such as cross-section observation is performed. Therefore, in a case where no abnormality is found in a position estimated as a failure factor, re-evaluation of a defective sample cannot be performed. Therefore, in the failure analysis of the electronic device, an analysis technology by the nondestructive analysis or an analysis technology capable of locating the defective positions with high probability at a stage of a semi-destructive analysis is desired.

With respect to such a demand, the prober device is proposed in which the electronic device is polished to the vicinity where the defective position is present, an extremely minute probe directly is brought into contact with a circuit of the electronic device, and electric characteristics of the electronic device are evaluated.

In JP-A-2013-187510 (PTL 1), by using a scanning electron microscope (SEM), the electric characteristics are measured by bringing a minute probe into contact with a minute transistor or the like present on a sample surface while observing the probe and an enlarged image of the sample surface. With this, it is possible to evaluate the electric characteristics of only one of 100 million transistors present in the sample which was difficult so far.

CITATION LIST

Patent Literature

PTL 1: JP-A-2013-187510

SUMMARY OF INVENTION

Technical Problem

As a result of an earnest study on a dynamic response analysis of a fine-Structured device in a prober device, present inventors obtained the following findings.

In past prober devices for fine-Structured device characteristic evaluation, static electric characteristics were evaluated which are a phenomenon that a current flows when a DC voltage is applied. In a case where the static electric characteristics of a transistor to be defective is compared with the static electric characteristics of a normal transistor and these characteristics are not equivalent, it is determined as the defective position.

Meanwhile, in a case where these transistors are actually used, the transistors are operated with high-speed driving signals of megahertz order and gigahertz order. More precisely, in order to evaluate the electric characteristics of the transistor, it is desirable that a response analysis (dynamic analysis or dynamic evaluation) of a dynamic signal which is a state close to an actual operation environment, can be performed.

Furthermore, in the failure analysis of the transistor, there is concern that there are defects that cannot be distinguished by only evaluation of the static electric characteristics. Therefore, recently, the need for the dynamic response analysis by the prober device is increasing.

In the response analysis of a high-speed dynamic signal, it is necessary that a high-speed signal to be input is transmitted to a sample without deterioration and a response signal of the sample is outputted to an oscilloscope without deterioration.

A measurement system that needs to transmit such a high-speed signal needs to have a sufficient frequency bandwidth with respect to a frequency to be measured. In order to transmit a higher speed signal (high-frequency signal), a large frequency bandwidth is required. In such a system, it is important to optimize a transmission path to suppress loss in transmission and to suppress impedance fluctuation to prevent signal reflection and loss due to structures and parts present in the transmission path.

Figure 1:
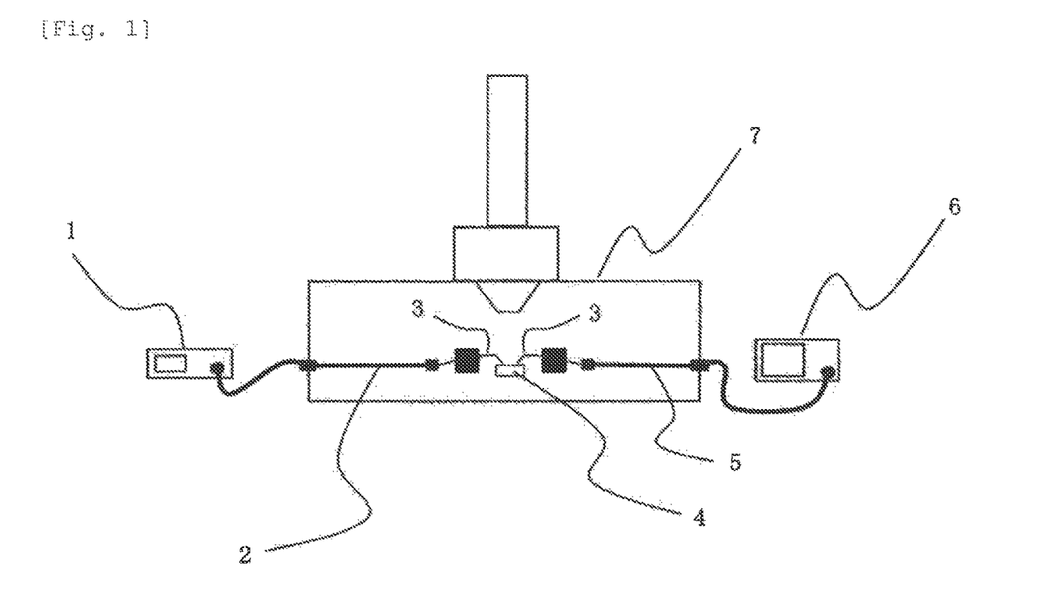
FIG. 1 is a schematic diagram of a measurement path of a prober device.

FIG. 1 is a schematic diagram of a measurement path of the prober device. In the prober device, an input signal generated from a function generator 1 is sent to a probe 3 through an input cable 2, and applied to a sample 4. The response signal of the sample 4 is observed by an oscilloscope 6 through an output cable 5. Here, since it is necessary to operate the probe 3 in a vacuum chamber 7, the input cable 2 is disposed in the vacuum chamber 7. With this, the length of the input cable 2 is fixed, and the total cable length is processed as a meter-order scale that is greatly different from a micro scale equal to or less than a millimeter such as an integrated circuit board. Such a difference in the scale tends to cause an increase of transmission loss and reflection of each unit configuring the measurement system and which becomes a harmful effect in high-speed transmission.

In addition, the input cable 2 and the output cable 5 are implemented with a GND cover, but the probe 3 is not implemented with the GND cover. With such a structure, impedance fluctuation can be large.

Furthermore, in measurement by the prober device, after the sample 4 is polished to a layer to be brought into contact with the probe 3, the sample 4 is disposed in the prober device and the probe 3 is brought into contact with a polished surface of the sample 4 such that the measurement is performed.

Figure 2A:
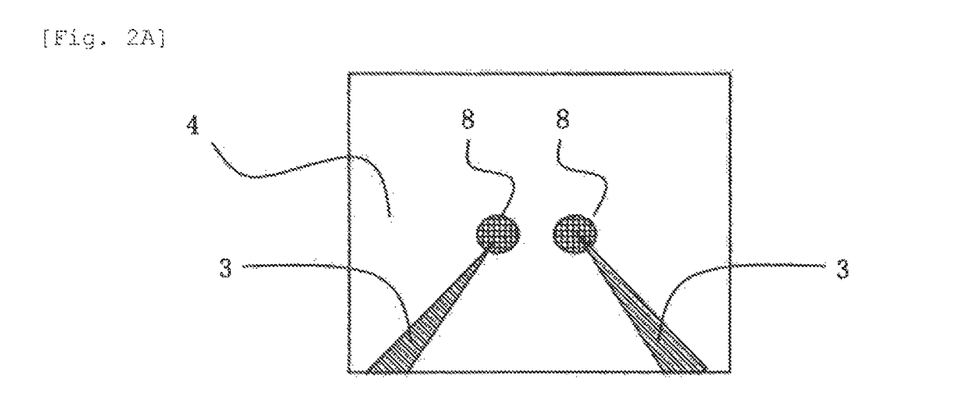
FIG. 2A is a diagram illustrating a state where a probe is in contact with a sample.
Figure 2B:
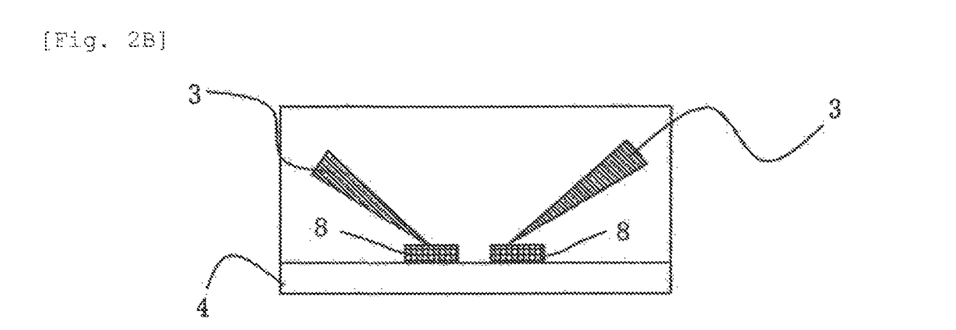
FIG. 2B is a diagram illustrating the state where the probe is in contact with the sample.

FIG. 2A and FIG. 2B are schematic diagrams at the time of measurement by the prober device, and illustrate a state in which the probe 3 is in contact with the polished surface of the sample 4, FIG. 2A is a top view, and FIG. 2B is a side view. In order to measure electric characteristics of the sample 4, the probe 3 is in contact with a contact 8 of the sample 4, but contact resistance due to dirt on a contact surface of an order of several tens of nanometers also causes impedance fluctuation.

Due to factors that deteriorate these frequency bandwidths, the response analysis of the dynamic signal in the prober device becomes difficult at a megahertz level at which the LSI is actually operated, in particular, at a frequency of an order of gigahertz.

An object of the present invention is to perform the failure analysis of the fine-Structured device such as a minute transistor configuring the LSI by using the dynamic signal equal to or greater than the megahertz level in the prober device.

Solution to Problem

The present invention relates to shaping of an input waveform of a dynamic electric signal inputted to one of the probes and observing of an output waveform of a dynamic electric signal output through the sample when the response analysis of the dynamic signal is performed with respect to the fine-Structured device in the prober device, or adjusting of the input waveform such that an output waveform of the dynamic electric signal output through the sample becomes approximately a pulse shape.

Advantageous Effects of Invention

According to the present invention, with respect to the fine-Structured device such as the minute transistor configuring the LSI, it is possible to perform the response analysis of a high-speed dynamic signal equal to or greater than a megahertz level.

DESCRIPTION OF EMBODIMENTS

In Example, disclosed is a prober device including a sample stage that holds a sample, a plurality of probes that come into contact with predetermined positions of the sample, a sample room in which the sample stage and the plurality of probes are disposed in an inside thereof, a charged particle beam microscope for observing the sample and the probe, an input waveform forming mechanism that shapes an input waveform of a dynamic electric signal to be input to one of the probes and an output waveform observing mechanism for observing an output waveform of the dynamic electric signal output through the sample.

In addition, in the Example, it is disclosed that the input waveform is adjusted such that the output waveform of the dynamic electric signal output through the sample becomes approximately a pulse shape. In addition, in the Example, it is disclosed that the input waveform is convex at the front part of a waveform or is concave at the rear part of the waveform.

In addition, in the Example, disclosed is the prober device including a database in which the input waveform of the dynamic electric signal is recorded, and the input waveform forming mechanism forms the input waveform recorded in the database according to a condition of the dynamic electric signal to be input.

In addition, in the Example, disclosed is the prober device in which the input waveform forming mechanism automatically forms the input waveform based on equivalent circuit simulation of a measurement system.

In addition, in the Example, disclosed is the prober device in which the input waveform forming mechanism automatically corrects the output waveform such that the output waveform becomes approximately rectangular based on the output waveform.

Hereinafter, the above and other novel features and effects will be described with reference to the drawings.

Example 1

Figure 3:
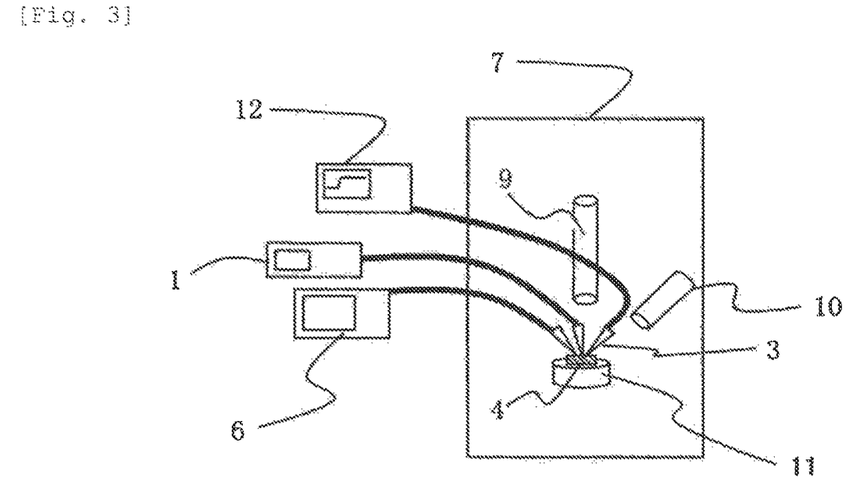
FIG. 3 is a schematic diagram of the prober device for fine-Structured device characteristic evaluation of Example 1.

FIG. 3 is a schematic diagram of the prober device for fine-Structured device characteristic evaluation of the Example.

The prober device in the Example includes a probe 3 for measuring electric characteristics of the sample 4 by being brought into contact with a contact or the like on a sample 4 in a vacuum chamber 7 which can maintain vacuum therein, a SEM column 9 for irradiating the probe 3 and the sample 4 with an electron beam, and a secondary electron detector 10 for detecting secondary electrons generated from the probe 3 and the sample 4 by the irradiation with the electron beam.

In addition, in the prober device, a probe driving mechanism (not shown) for driving the probe 3 and a sample stage 11 for moving a position of the sample 4 are provided.

In a case where the electric characteristics of a transistor are obtained, since it is necessary to bring the probe into contact with each contact of a source, a drain, and a gate, at least three probes 3 are required. When considering the probe 3 to come in contact with a substrate, a preliminary probe for a case where damage occurs in the probe 3, or the like, the number of the probes may be more than three, and, for example, six or more probes may be provided.

Movement of the probe 3 and the sample stage 11 is operated by a measurer using a control terminal (not shown).

The probe 3 is moved to the desired contact, the probe 3 is brought into contact with the contact, a measurement signal is sent from the function generator 1 to an oscilloscope 6 via the probe 3, a voltage required for driving the transistor is applied by a semiconductor parameter analyzer 12, and dynamic response characteristics are obtained such that the electric characteristics of the sample 4 are analyzed and evaluated.

Figure 4A:
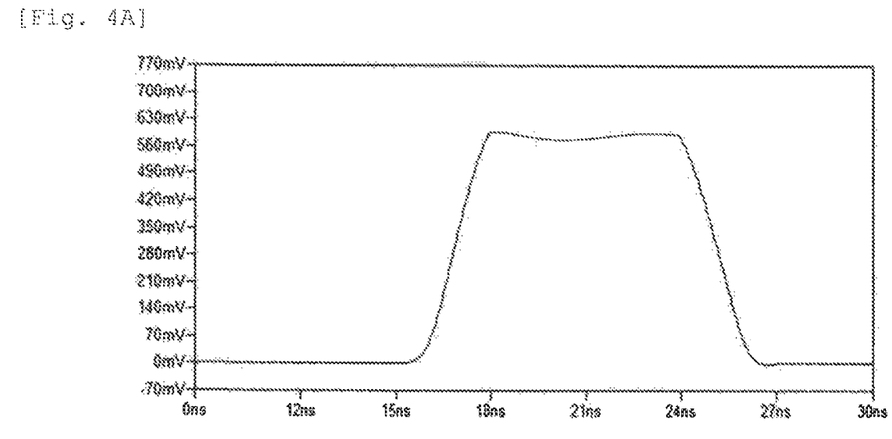
FIG. 4A is a graph for explaining the influence of a frequency bandwidth on a pulse shape.
Figure 4B:
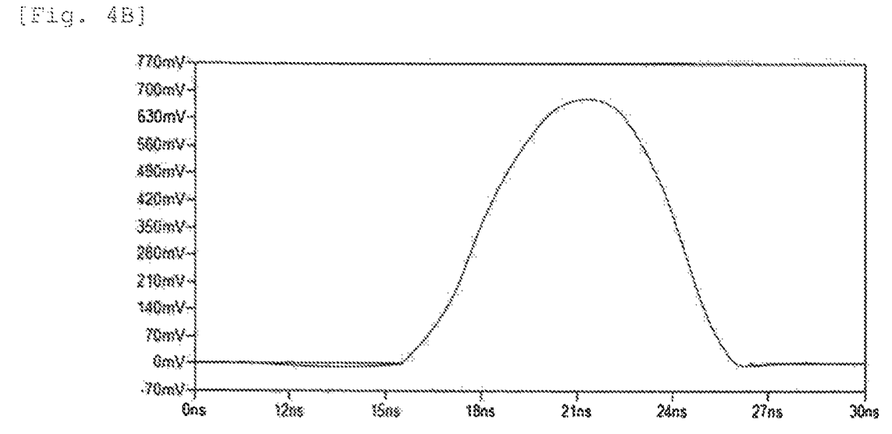
FIG. 4B is a graph for explaining the influence of the frequency bandwidth on the pulse shape.
Figure 4C:
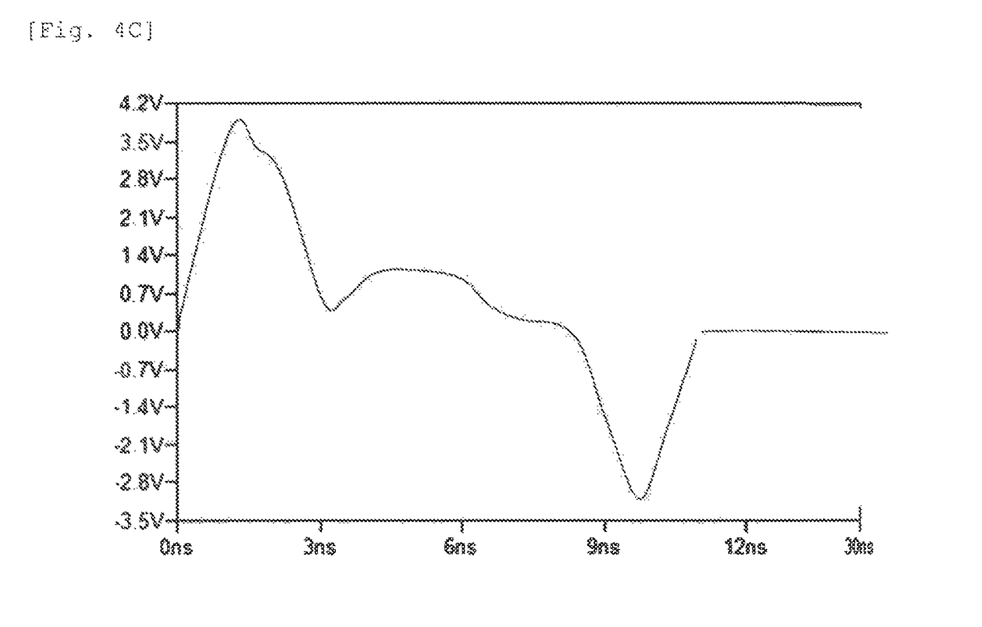
FIG. 4C is a graph for explaining the influence of the frequency bandwidth on the pulse shape.

Here, as described above, due to a unique configuration of the prober device, it is difficult to secure a frequency bandwidth to be transmitted. FIG. 4A to FIG. 4C are graphs for explaining the influence of the frequency bandwidth on the pulse shape. When a bandwidth of sufficient transmission frequency is secured, in a case where a pulse wave is transmitted to this system, a clean rectangular wave is maintained and output (FIG. 4A). Meanwhile, in a case where the frequency bandwidth of a transmission signal is small, a rising portion of a rectangle in a pulse waveform to be input deteriorates (FIG. 4B). This is because the pulse waveform is configured with a large number of frequency components, and the rising and falling portions of the rectangle in the pulse waveform correspond to a high-frequency component. That is, in the measurement system with a small transmission bandwidth, this high-frequency component deteriorates, and as a result, the rectangle of the obtained pulse waveform is not maintained in a rising shape as illustrated in FIG. 4B. Meanwhile, in other words, by observing the shape of the rising of this rectangle, characteristics of a measurement object at a higher frequency can be grasped.

In the Example, when measuring dynamic response characteristics in the prober device, the input waveform is shaped such that an output signal waveform becomes rectangular and signal deterioration in a transmission system of the prober device is compensated. By comparing rising of a standard sample in which the rectangle is maintained with rising of an output signal of a comparative sample by using this transmission waveform, it is possible to measure differences in the sample characteristics at a higher frequency.

FIG. 4C is a representative shape of the input waveform of which the waveform is shaped. Transmission deterioration in a portion corresponding to a rising or falling portion where deterioration is expected is corrected as a shape in which a voltage is rapidly raised or lowered to compensate for. In actual measurement, a rising amount and a rise time of the voltage of this shape are determined by the equivalent circuit simulation of the measurement system.

Example 2

In the Example, the failure analysis by the prober device for the fine-Structured device characteristic evaluation will be described. Hereinafter, differences from Example 1 will be mainly described.

Figure 5:
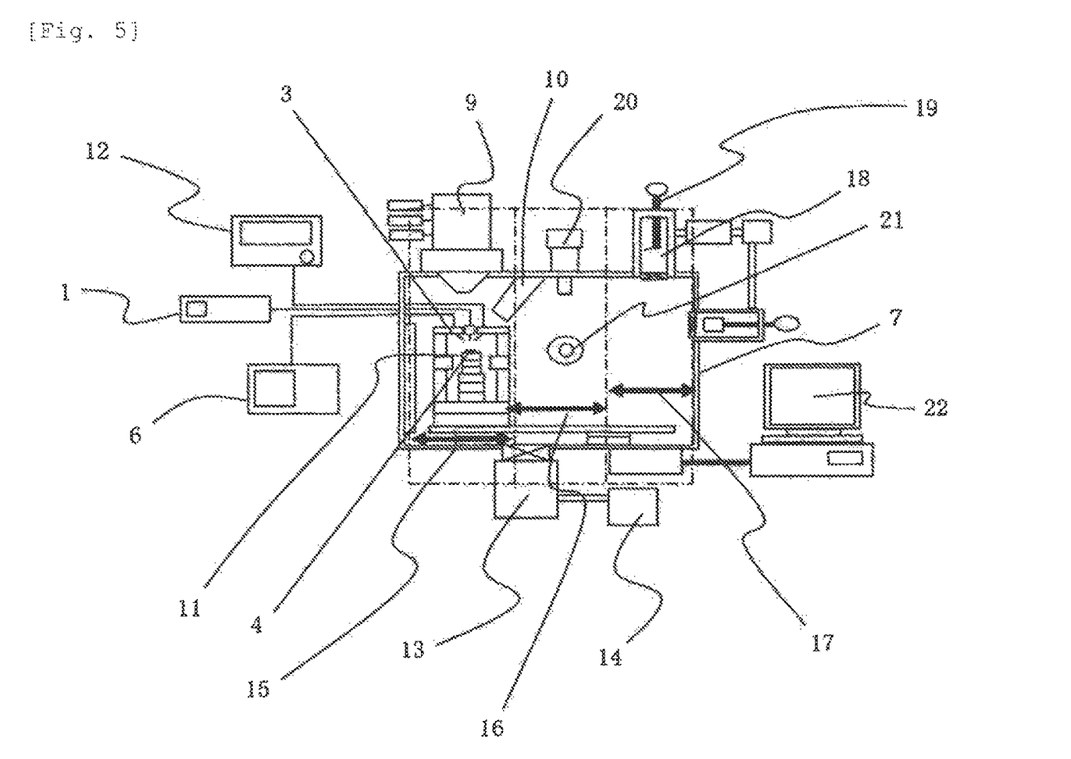
FIG. 5 is a configuration diagram of a prober device for fine-Structured device characteristic evaluation of Example 2.

FIG. 5 is a configuration diagram of the prober device for the fine-Structured device characteristic evaluation of the Example. The prober device for evaluating the fine-Structured device characteristics includes the probe 3 for measuring the electric characteristics and the sample stage 11 in which the sample 4 of the electronic device or the like can be installed in the vacuum chamber 7.

In addition, the prober device further includes the SEM column 9 for irradiating the probe 3 and the sample 4 with the electron beam, and the secondary electron detector 10 for detecting the secondary electrons generated from the probe 3 and the sample 4 by the irradiation with the electron beam.

A turbo molecular pump 13 and a dry pump 14 for exhausting air in an inside thereof are provided in the vacuum chamber 7. As long as a pump can keep the inside of the vacuum chamber 7 in a vacuum state, a type of the pump is not limited, but the pump which can maintain higher vacuum and not contaminate the vacuum chamber 7 is preferable.

The inside of the vacuum chamber 7 is divided by a sample observation region 15 by the SEM, a sample observation region 16 by an optical microscope, and a probe exchange region 17. By moving the sample stage 11 to these regions, it is possible to perform sample observation by the SEM, the sample observation by the optical microscope, and the exchange of the probe.

The sample stage 11 is basically disposed under the SEM column 9. Furthermore, the probe 3 is disposed between the sample stage 11 and the SEM column 9. The number of the probes 3 is four in the Example. Then, the probe 3 is fixed to a probe driving device (not shown).

The probe 3 is moved to the probe exchange region 17 and the probe 3 is pulled to a probe exchange chamber 18 by using a probe lifting rod 19 such that the probe 3 can be exchanged.

In order to measure the electric characteristics of the sample 4, when the probe 3 is brought into contact with the sample 4, the sample stage 11 is moved to the sample observation region 16 first by the optical microscope. A first CCD camera 20 for observing the sample 4 in the top surface direction and a second CCD camera 21 for observing the sample 4 in the lateral direction are installed at the region. The probe 3 is driven while observing videos of these CCD cameras 20 and 21 such that it is possible to move the probe 3 to a position in which the desired contact is present with an accuracy of approximately 0.1 mm.

In the sample 4, a size of a pattern which is actually desired to be measured is often 100 nm or less in diameter. Therefore, after the above positioning, the sample stage 11 is moved to the sample observation region 15 by the SEM. Then, the probe 3 is operated while observing a SEM image such that the probe 3 is moved to a measurement position more precisely.

Each of the probes 3 is connected to a semiconductor parameter analyzer 12 for measuring the electric characteristics of the electronic device, the function generator 1 for generating a dynamic signal, and the oscilloscope 6 for observing a waveform of a dynamic response signal. The function generator 1 has a function which can arbitrarily create the signal waveform to be generated.

An operation of the device, for example, the movement of the probe 3 and the sample stage 11 is controlled by a graphical user interface (GUI) displayed on a display 22. Regardless of the GUI, control by an operation panel or the like may be used.

Next, a measurement method of the sample 4 will be described.

First, by narrowing down the transistor estimated as defective from failure diagnosis or the like, the sample 4 is polished until a surface of a desired contact of the normal transistor is exposed.

Next, after the sample 4 in which the surface of the contact is exposed is installed on the sample stage 11, the probe 3 is brought into contact with the contact. The probe 3 is brought into contact with the contact of each of the source, the drain, the gate, and the substrate of the transistor.

The probe brought into contact with the drain and the substrate is connected to the semiconductor parameter analyzer 12, the probe brought into contact with the gate is connected to the function generator 1, and the probe brought into contact with the source is connected to the oscilloscope 6.

After each of the probes 3 is brought into contact with each contact, a voltage of 1 V is applied to the drain and a voltage of 0 V is applied to the substrate (grounded). The voltage of 1 V is applied to the gate with the frequency of 100 MHz (pulse width 5 ns) by the function generator 1. A signal from the source at this time is observed with the oscilloscope 6.

If an output response waveform is not the rectangular, the input waveform is shaped. By the waveform shaping, a rise time of 0.7 ns is realized from a pulse shape of 100 MHz. Next, by using the same measurement condition and the input waveform, the dynamic response waveform of the transistor estimated as the defective is observed. As a result, as compared to the normal transistor, in a case where deterioration is observed in the rise time, it can be determined that the transistor is in failure and defective.

Example 3

In the Example, a case where the input waveform is selected from the database will be described. Hereinafter, differences from Examples 1 and 2 will be mainly described.

Figure 6:
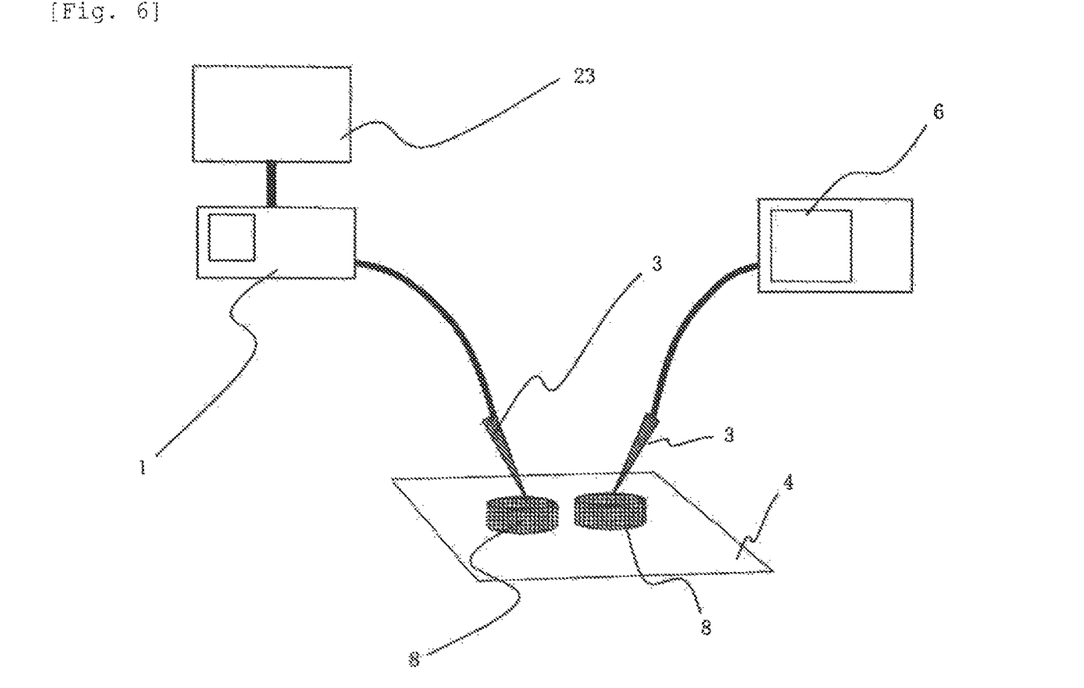
FIG. 6 is a schematic diagram of a prober device for fine-Structured device characteristic evaluation of Example 3.

FIG. 6 is a schematic diagram of the prober device for the fine-Structured device characteristic evaluation of the Example. In the Example, after the probe 3 is brought into contact with each of the contacts 8, the voltage of 1 V is applied to the drain, and the voltage of 0 V is applied to the substrate. When a signal is input to the gate by the function generator 1, the waveform is selected from a database 23 in which waveforms to be used are accumulated based on a frequency to be measured or a type of the sample. With this, an optimum input waveform is applied to the sample and the measurement of the dynamic response signal is performed by the oscilloscope 6.

Example 4

In the Example, a case where the input waveform is determined by using search algorithm will be described. Hereinafter, differences from Examples 1 to 3 will be mainly described.

Figure 7:
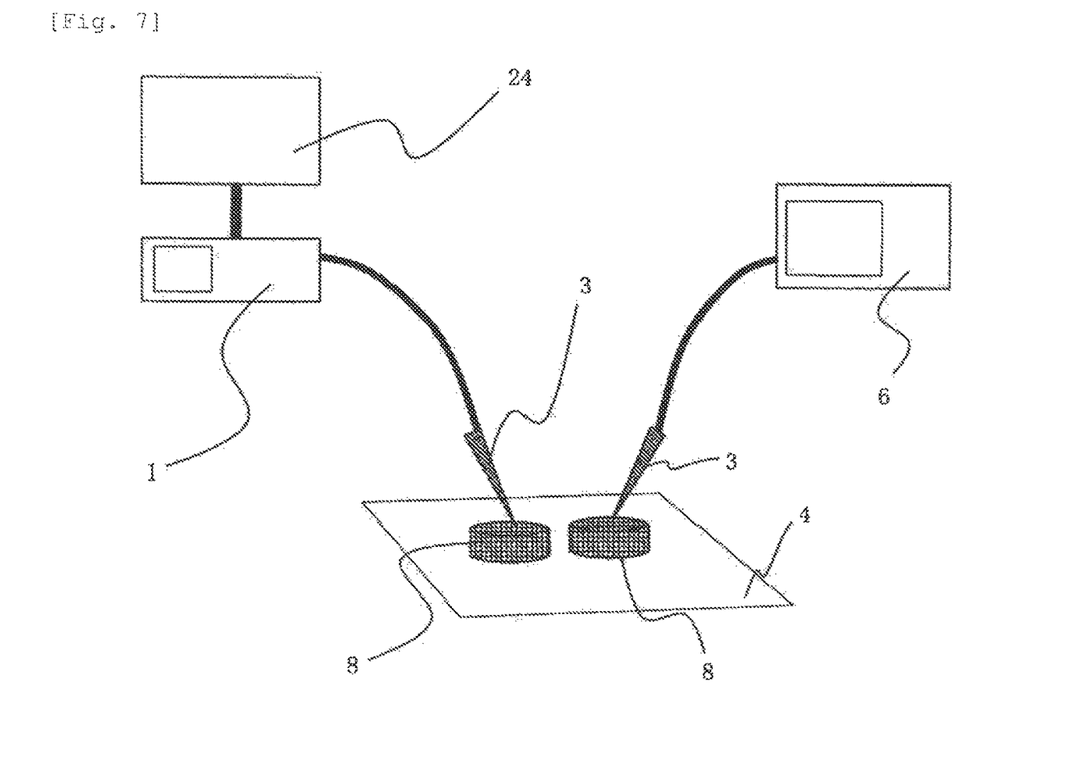
FIG. 7 is a schematic diagram of a prober device for fine-Structured device characteristic evaluation of Example 4.

FIG. 7 is a schematic diagram of the prober device for the fine-Structured device characteristic evaluation of the Example. In the Example, after the probe 3 is brought into contact with each of the contacts 8, the voltage of 1 V is applied to the drain and the voltage of 0 V is applied to the substrate. Before a signal is input to the gate by the function generator 1, an output simulation waveform is derived by using an equivalent circuit simulator of the measurement system in the input waveform. An optimum input waveform is determined by using the search algorithm that repeatedly corrects the simulation waveform to be input such that the waveform becomes rectangular. Performance of a simulation calculation and the search algorithm are performed by a calculation processing unit 24 that instructs the input waveform to the function generator 1. With this, the optimized input waveform is applied to the sample, and the measurement of the dynamic response signal is performed by the oscilloscope 6.

Example 5

In the Example, a case where measurement of the dynamic response signal is performed while correcting the input waveform will be described. Hereinafter, differences from Examples 1 to 4 will be mainly described.

Figure 8:
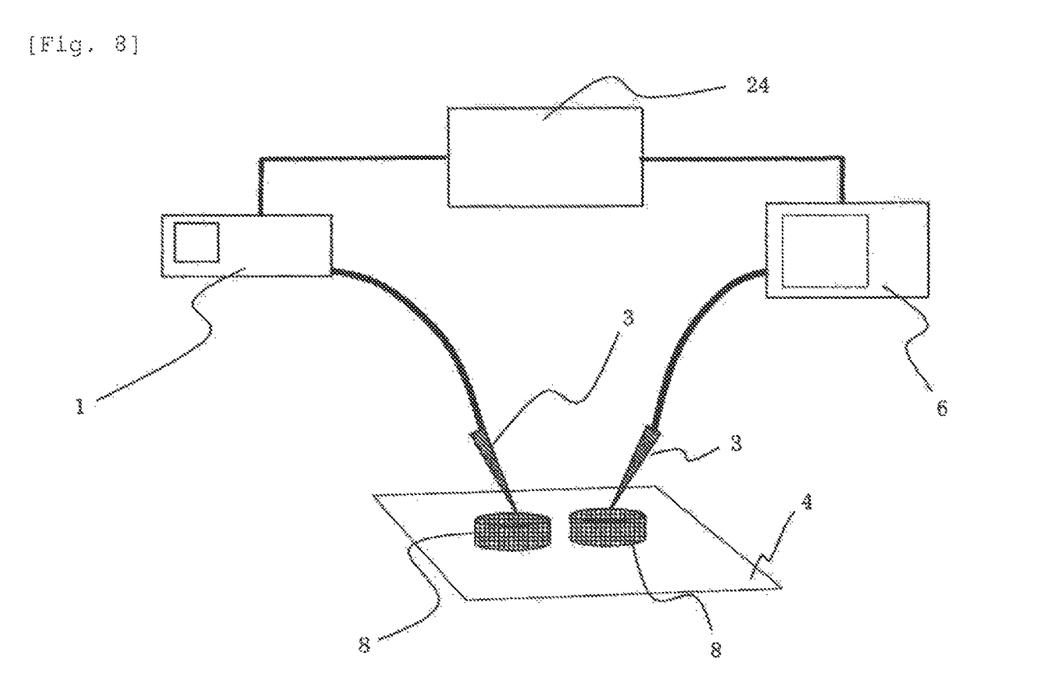
FIG. 8 is a schematic diagram of a prober device for fine-Structured device characteristic evaluation of Example 5.

FIG. 8 is a schematic diagram of the prober device for the fine-Structured device characteristic evaluation of the Example. In the Example, after the probe 3 is brought into contact with each of the contacts 8, the voltage of 1 V is applied to the drain and the voltage of 0 V is applied to the substrate. A signal is input to the gate by being automatically repeated by the function generator 1. At this time, the output waveform from the sample 4 is repeatedly obtained, and the measurement of the dynamic response signal is performed while the input waveform is not corrected such that the waveform becomes rectangular. The correction of the input waveform is performed in the calculation processing unit 24 that receives signal information from the oscilloscope 6. By sending a corrected result from the calculation processing unit 24 to the function generator 1, the input waveform to be generated is shaped.

REFERENCE SIGNS LIST

1 . . . function generator
2 . . . input cable
3 . . . probe
4 . . . sample
5 . . . output cable
6 . . . oscilloscope
7 . . . vacuum chamber
8 . . . contact
9 . . . SEM column
10 . . . secondary electron detector
11 . . . sample stage
12 . . . semiconductor parameter analyzer
13 . . . turbo molecular pump
14 . . . dry pump
15 . . . sample observation region by SEM
16 . . . sample observation region by optical microscope
17 . . . probe exchange region
18 . . . probe exchange chamber
19 . . . probe lifting rod
20 . . . CCD camera
21 . . . CCD camera
22 . . . display
23 . . . database
24 . . . calculation processing unit

The invention claimed is:

1. A prober device comprising:
a sample stage that holds a sample;
a plurality of probes that come into contact with predetermined positions of the sample;
a sample room in which the sample stage and the plurality of probes are disposed in an inside thereof;
a charged particle beam microscope for observing the sample and the plurality of probes;
an input waveform forming mechanism that shapes an input waveform of a dynamic electric signal to be input to one of the probes; and
an output waveform observing mechanism for observing an output waveform of the dynamic electric signal output through the sample,
wherein the input waveform forming mechanism shapes the input waveform such that the output waveform becomes rectangular when the plurality of probes is contacted with the contacts of a normal transistor of the sample, and the output waveform observing mechanism obtains the dynamic response characteristic of another transistor that receives the shaped input waveform of the sample.

2. The prober device according to claim 1,
the input waveform forming mechanism is configured to adjust the input waveform such that the output waveform of the dynamic electric signal output through the sample becomes approximately a pulse shape.

3. The prober device according to claim 2,
the input waveform forming mechanism is configured to shape the input waveform with at least one of a convex portion at a front part of the input waveform and a concave portion at a rear part of the input waveform.

4. The prober device according to claim 1, further comprising:
a database in which the input waveform of the dynamic electric signal is recorded,
the input waveform forming mechanism configured to form the input waveform recorded in the database according to a condition of the dynamic electric signal to be input.

5. The prober device according to claim 1,
the input waveform forming mechanism configured to automatically form the input waveform based on equivalent circuit simulation of a measurement system.

6. The prober device according to claim 1, further comprising:
a first CCD camera disposed above a top surface of the sample to observe the sample from above; and
a second CCD camera disposed adjacent to a side surface of the sample to observe the sample from a lateral direction.

7. The prober device according to claim 1,
the sample room is divided into a first sample observation region for observation by a scanning electron microscope, a second sample observation region for observation by an optical microscope, and a probe exchange region.

8. The prober device according to claim 7,
the sample stage being movable between the first sample observation region, the second sample observation region, and the probe exchange region.

* * * * *